US005451567A

United States Patent [19]

Das

[11] Patent Number: 5,451,567

[45] Date of Patent: Sep. 19, 1995

[54] HIGH POWER FERROELECTRIC RF PHASE SHIFTER

[76] Inventor: Satyendranath Das, P.O. Box 574, Mt. View, Calif. 94042-0574

[21] Appl. No.: 219,913

[22] Filed: Mar. 30, 1994

[51] Int. Cl.⁶ .......................... H01P 1/18; H01P 9/00; H03H 11/16; H01B 12/02

[52] U.S. Cl. .................................... 505/210; 505/700; 505/701; 505/866; 333/99.005; 333/161

[58] Field of Search ................ 333/161, 995; 505/204, 505/210, 700, 701, 866

[56] References Cited

U.S. PATENT DOCUMENTS

| | | | |
|---|---|---|---|
| 5,212,463 | 5/1993 | Babbitt et al. | 333/161 |
| 5,307,033 | 4/1994 | Koscica et al. | 333/161 |

OTHER PUBLICATIONS

Jackson, C. M. et al., "Novel Monolithic Phase Shifter Combining Ferroelectrics and High Temperature Superconductors"; *Microwave & Optical Tech Letters;* vol. 5, No. 14, 20 Dec. 1992 pp. 722–726.

*Primary Examiner*—Benny T. Lee

[57] ABSTRACT

The high power ferroelectric RF phase shifter contains a ferroelectric material in a microstrip line section. Between the ferroelectric phase shifter and the input, there is a ferroelectric matching transformer. Between the ferroelectric phase shifter and the output, there is a quarter wave ferroelectric matching transformer. A bias field is connected across the top and bottom surfaces of the ferroelectric material. When a bias field is applied across the ferroelectric material, the permittivity is reduced and as such the velocity of propagation is increased. This causes an increase in the effective electrical length of the phase shifter. Increasing the bias voltage increases the phase shift. The ferroelectric RF phase shifter may be constructed of a ferroelectric liquid crystal (FLC). The ferroelectric material is operated above its Curie temperature.

8 Claims, 3 Drawing Sheets

HIGH POWER FERROELECTRIC RF PHASE SHIFTER

FIELD OF INVENTION

The present invention relates to phase shifters for electromagnetic waves and more particularly, to RF phase shifters which can be controlled electronically.

DESCRIPTION OF THE PRIOR ART

Ferroelectric materials have a number of attractive properties. Ferroelectrics can handle high Peak power. The average power handling capacity is governed by the dielectric loss of the material. They have low switching time (such as 100 nS). Some ferroelectrics have low losses. The permittivity of ferroelectrics is generally large, as such the device is small in size. The ferroelectrics are operated in the paraelectric phase i.e. slightly above the Curie temperature. Inherently, they have a broad bandwidth. They have no low frequency limitation as contrasted to ferrite devices. The high frequency operation is governed by the relaxation frequency, such as 95 GHz for strontium titanate, of the ferroelectric material. The loss of the ferroelectric high Tc superconductor RF phase shifter is low with ferroelectric materials with a low loss tangent. A number of ferroelectrics are not subject to burnout.

There are three deficiencies of the current technology. (1) The insertion loss is high as shown by S. N. Das, "Ferroelectrics for Time Delay Steering of an Array," Ferroelectrics, vol. 5, pp. 253–257, 1973. The present invention uses low loss ferroelectrics as discused by Rytz et al. D Rytz, M. B. Klein, B. Bobbs, M. Matloubian and H. Fetterman, Dielectric Properties of $KTa_{1-x}Nb_xO_3$ at millimeter wavelengths," J. Appl. Phys. vol. 24 (1985), Supp. 24-2, pp. 1010–1012, and to reduce the conductor losses, uses a high Tc superconductor for the conductor. (2) The properties of ferroelectrics are temperature dependent as discussed by Rytz et al. supra. This invention uses the phase shifters at a constant high Tc superconducting temperature. (3) The third deficiency is the variation of the VSWR over the operating range of the phase shifter. The present invention uses a ferroelectric quarter wave matching transformer to obtain a good VSWR over the operating range of the phase shifter. The bandwidth of the phase shifter can be extended by using more than one matching transformer.

Depending on a trade-off study in an individual case, the best type of phase shifter can be selected.

SUMMARY OF THE INVENTION

The general purpose of this invention is to provide an electronically controlled variable phase shifter which embraces the advantages of similarly employed conventional devices such as ferrite and semiconductor phase shifters. This invention, in addition, reduces the conductive losses.

It is an object of this invention to provide a voltage controlled ferroelectric phase shifter which uses lower control power and is capable of handling high peak and average powers than conventional phase shifter. High Tc superconducting materials can handle a power level of up to 0.5 MW. Another objective of this invention is to build reciprocal phase shifters with a low loss. Another objective is to have a phase shifter operating from a low frequency to up to at least 95 GHz.

These and other objectives are achieved in accordance with the present invention which comprises a microstrip line having an input matching section, a phase shifter section and an output matching section. The phase shifter section is constructed from a solid or liquid ferroelectric material, including $KT_{a1-x}Nb_xO_3$ (KTN), the permittivity of which changes with the changes in the applied bias electric field. This change in the permittivity produces a time delay or phase shift. By selecting an appropriate percentage of x in the $KTa_{1-x}Nb_xO_3$ material, the Curie temperature of the ferroelectric material can be brought slightly lower than the high Tc of a superconducting material. Strontium titanate and lead titanate composition is an example of another ferroelectric.

With these and other objectives in view, as will hereinafter more fully appear, and which will be more particularly pointed out in the apppended claims, reference is now made to the following description taken in connection with accompanying drawings.

DETAILED DESCRIPTION OF THE PREFERRED EMBODIMENT

Figure 1:
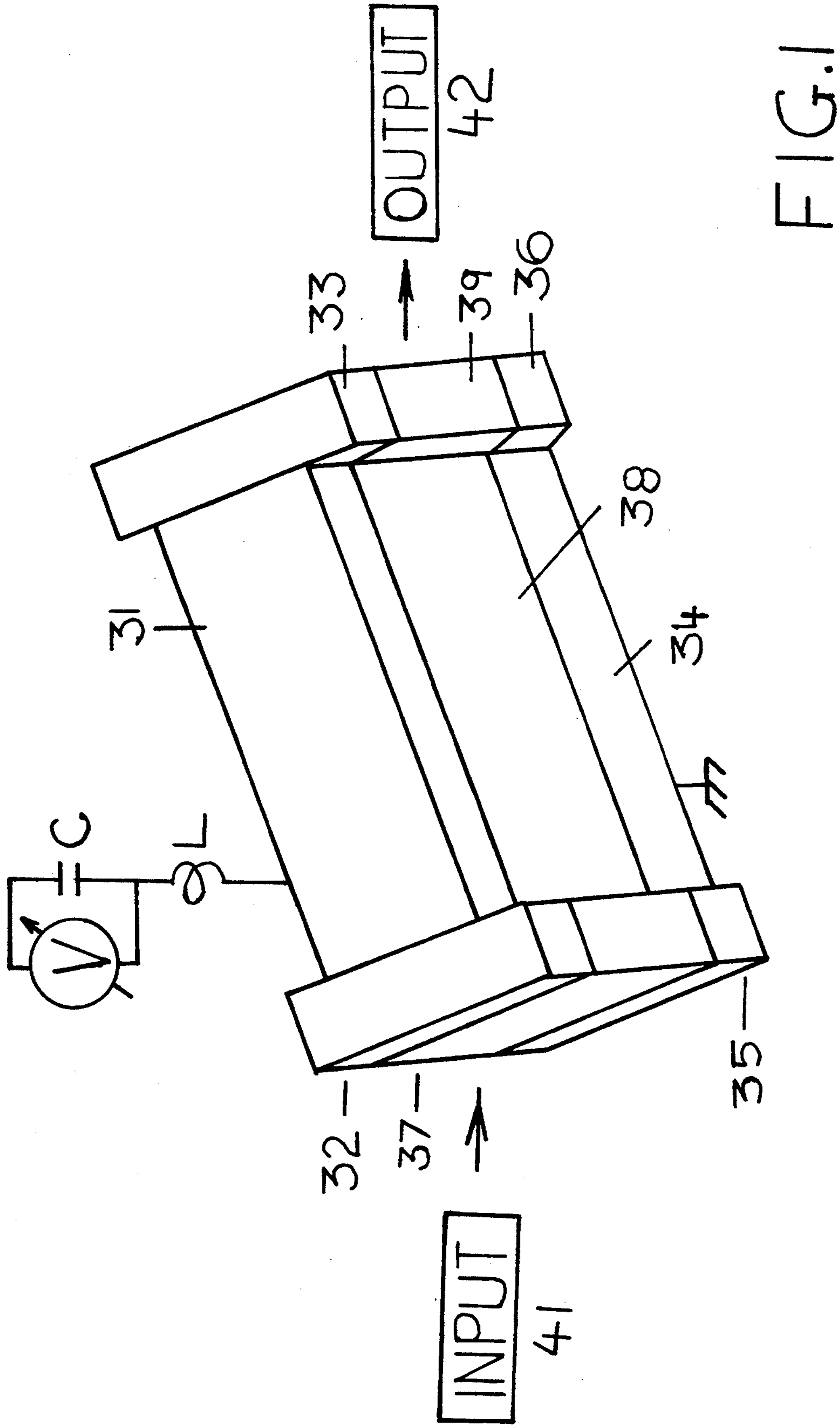
FIG. 1 is a pictorial schematic of a microstrip line phase shifter.

Referring now to the drawings, there is illustrated in FIG. 1 a typical microwave or millimeter wave circuit configuration that incorporates the principles of the present invention.

In FIG. 1, there is depicted a microstrip line embodiment 30 of this invention. 38 is a slab or a film of a ferroelectric material whose top 31 and bottom 34 surfaces are deposited with a conductive material. As the permittivity of a ferroelectric material is generally large, the impedance of the microstrip line 31 is generally low. For matching to the input and the output, a quarter wavelength, at the operating frequency of the phase shifter, transformer is used, one at the input and a second one at the output end of the ferroelectric microstrip line 31. The quarter wavelength transformers are made of the same or another ferroelectric material. 37 is the input slab or film of a ferroelectric material used for the quarter wave matching transformer. The top 32 and the bottom 35 surfaces of the input quarter wavelength matching transformer are coated with a conductive material. 39 is the output slab or film of a ferroelectric material for the quarter wavelength matching transformer. The top 33 and the bottom 36 surfaces of the output quarter wavelength matching transformer are deposited with a conductive material. The input is 41 and the output is 42, conversely, an input 42, and an output 41 can be provided as the phase shifter is reciprocal. The bias voltage V is applied through an LC filter.

Figure 2:
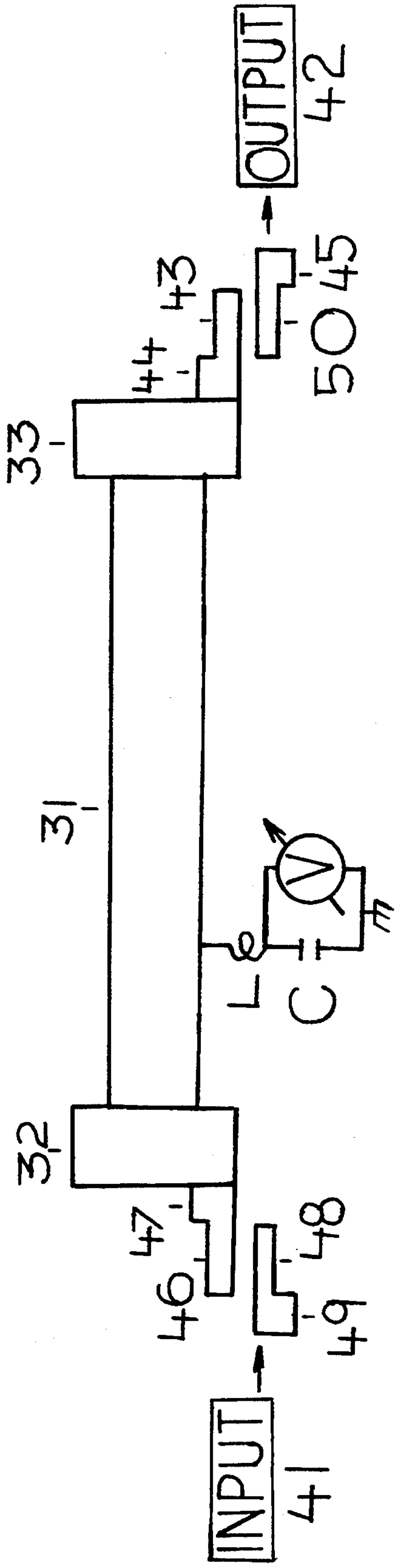
FIG. 2 is a top view of the microstrip line phase shifter with d.c. blocking filters.

In FIG. 2, there is depicted the same phase shifter, as shown in FIG. 1, with an edge coupled filter at each of the input and the output to isolate the bias circuit from the input and the output microwave circuits.

The quarter wavelength, at the operating frequency of the phase shifter, microstrip line 43 on a dielectric material is attached, through a microstrip line 44 of an appropriate length, to the output quarter wave matching transformer conductive material 33. The quarter wavelength long microstrip line 50 is edge coupled to the microstrip line 43. The microstrip line 45, of appropriate length is used so that the edge coupled filter is not affected by the output circuit.

The quarter wavelength, at the operating frequency of the phase shifter, microstrip line 46, on a dielectric material, is attached through a microstrip line 47 of an appropriate length, to the input quarter wavelength transformer conductive material 32. The quarter wavelength long microstrip line 48 is edge coupled to the microstrip line 46. The microstrip line 49, of an appropriate length, is used so that the edge coupled filter, there is not affected by the input circuit. The conducting material on the ferroelectric material is 31. The input is 41 and the output is 42. The bias voltage V is applied through an LC filter.

Figure 3:
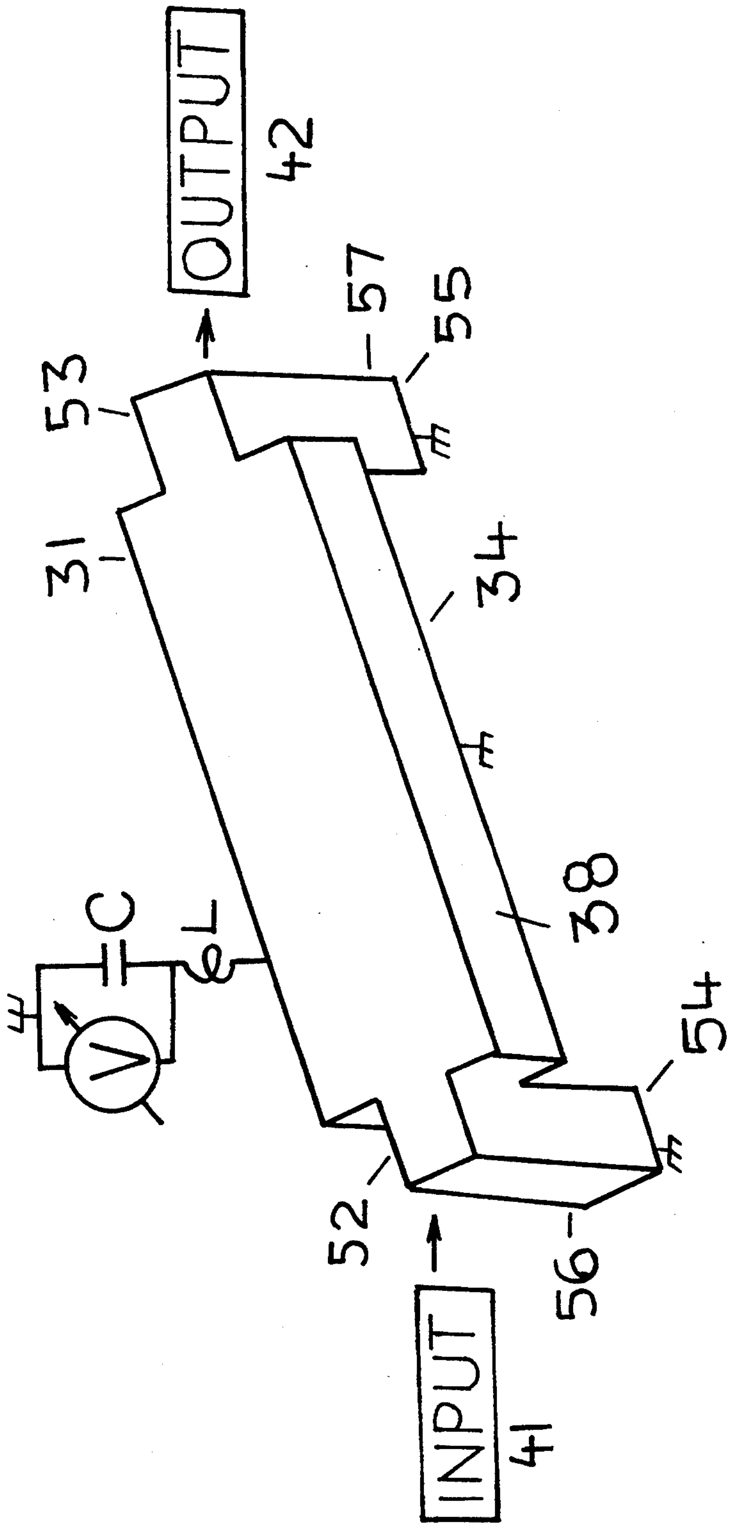
FIG. 3 is a pictorial schematic of a microstrip line phase shifter.

In FIG. 3 is shown another embodiment of this invention. The ferroelectric material 38 has its top 31 and bottom 34 surfaces deposited with conductors. The input quarter wavelength transformer ferroelectric material is 56 whose top 52 and bottom 54 surfaces are deposited with conductors. Compared to the phase shifter microstrip line, the quarter wavelength transformer has a smaller width and a larger height. The output quarter wavelength ferroelectric material is 57 whose top 53 and bottom 55 surfaces are deposited with conductors. Compared with the phase shifter microstrip line, the microstrip line of the output quarter wavelength transformer has a smaller width and a larger height. The input is 41 and the output is 42. The conductors are made of conducting materials and a film of a single crystal high Tc superconductor material. Both the input and the output quarter wavelength matching transformers are made of a ferroelectric material which is the same as the ferroelectric material of the phase shifter.

The phase shifter is operated at the high Tc superconducting Tc currently between 77 and 105 degrees K. and increasing. The bias voltage V is applied through an LC filter.

The conductors and the conductive depositions are made of conductive materials and of a film of a single crystal high Tc superconductor material including YBCO. The embodiments shown in FIGS. 1, 2 and 3 are discrete devices as well as a part of a monolithic microwave integrated circuits (MMIC).

It should be understood that the foregoing disclosure relates to only typical embodiments of the invention and that numerous modification or alternatives may be made therein by those skilled in art without departing from the spirit and the scope of the invention as set forth in the appended claims. Specifically, the invention contemplates various dielectrics, ferroelectrics, ferroelectric liquid crystals (FLCs), high Tc superconducting materials impedances of microstrip lines, and operating frequencies of the phase shifter.

What is claimed is:

1. A high Tc superconducting ferroelectric phase shifter having an input, an output, a top, a bottom, a ground plane, an operating frequency, having Curie temperatures, being operated at a high Tc superconducting temperature, with an electric field dependent permittivity and comprising of:

a first microstrip line section disposed on a first ferroelectric material characterized by said permittivity;

a second microstrip line section disposed on a second ferroelectric material, characterized by said permittivity, being quarter wavelength long at the operating frequency of said phase shifter, for matching the impedance of an input of said phase shifter to the impedance of said first microstrip line and being a part thereof;

a third microstrip line section disposed on said second ferroelectric material, characterized by said permittivity, being quarter wavelength long, at the operating frequency of said phase shifter for matching the impedance of an output of said phase shifter to the impedance of said first microstrip, line and being a part thereof;

said second and third microstrip lines having respective widths being greater than a width of said first microstrip line;

said ground plane comprised of a conductive deposition on said bottom side of said phase shifter;

a film of a single crystal high Tc superconductor material continuously defining said first, second and third microstrip lines;

means, connected to the microstrip lines, for applying a variable bias electric field to change said permittivity of said ferroelectric materials of said phase shifter; and said phase shifter being operated at a constant high Tc superconducting temperature slightly above the Curie temperatures of the ferroelectric materials.

2. A ferroelectric phase shifter of claim 1 wherein said first and second ferroelectric materials being ferroelectric liquid crystal materials.

3. A ferroelectric phase shifter of claim 1 wherein said phase shifter being a MMIC.

4. A monolithic high Tc superconducting ferroelectric phase shifter having an input, an output, a top, a bottom, a ground plane, an operating frequency, being operated at a high Tc superconducting temperature, having a Curie temperature, with an electric field dependent permittivity and comprising of:

a first microstrip line section disposed on a first film of a ferroelectric material characterized by said permittivity;

a second microstrip line section disposed on a second film of a ferroelectric material, characterized by said permittivity, having a transformer being quarter wavelength long, at the operating frequency of the phase shifter for matching the impedance of an input of the phase shifter to the first microstrip line;

a third microstrip line section disposed on a third film of a ferroelectric material having a transformer being quarter wavelength long, at the operating frequency of the phase shifter for matching the impedance of said first microstrip line of the phase shifter to an output of the phase shifter;

said second and third microstrip lines having respective widths being smaller than a width of said first microstrip line;

said first, second and third microstrip lines being disposed and connected together on said respective ferroelectric films;

a film of a single crystal high Tc superconductor material continuously defining said first, second and third microstrip lines;

means, connected to said microstrip lines, for applying an electric field to the phase shifter to change the permittivity of said respective ferroelectric films and thus to obtain a differential phase shift; and said phase shifter being operated at a constant high Tc superconducting temperature slightly above the Curie temperature of the ferroelectric material.

5. A ferroelectric phase shifter of claim 4 wherein said phase shifter being a monolithic microwave integrated circuit (MMIC).

6. A ferroelectric phase shifter of claim 4 wherein the single crystal high TC superconductor being YBCO.

7. A high Tc superconducting monolithic ferroelectric phase shifter having an input, an output, a top, a bottom, a ground plane, an operating frequency, having edge coupled filters, having Curie temperatures, being operated at a high Tc superconducting temperature, with an electric field dependent permittivity and comprising of;

a first microstrip line section disposed on a first film of a first ferroelectric material characterized by said permittivity;

a second microstrip line section disposed on a second film of a second ferroelectric material having a transformer being quarter wavelength long, at the operating frequency of the phase shifter, for matching the impedance of an input of the phase shifter to the first microstrip line;

a third microstrip line section disposed on a third film of a second ferroelectric material having a transformer being quarter wavelength long, at the operating frequency of the phase shifter, for matching the impedance of said first microstrip line of the phase shifter to an output of the phase shifter;

said second and third microstrip lines having respective widths being greater than a width of said first microstrip line;

said first, second and third microstrip lines being disposed and connected together on said respective ferroelectric films;

a plurality of edge coupled filter respectively disposed at said input and at said output to isolate the bias voltage of said phase shifter from the input and the output of the phase shifter and comprising of:

a fourth microstrip line disposed on a film of a first dielectric material being quarter wavelength long at the operating frequency of said phase shifter, and being connected, with a first appropriate length of an uncoupled line, to said input quarter wavelength transformer;

a fifth microstrip line disposed on a film of a first dielectric material, edge coupled to said fourth microstrip line and being quarter wavelength long, at the operating frequency of said phase shifter, and being connected, with a first appropriate length of an uncoupled microstrip line, to the input;

a sixth microstrip line on a film of a first dielectric material being quarter wavelength long, at the operating frequency of said phase shifter, and being connected, with a first appropriate length of an uncoupled line, to said output quarter wavelength transformer;

a seventh microstrip line on a film of a first dielectric material, edge coupled to said sixth microstrip line and being quarter wavelength long, at the operating frequency of said phase shifter, and being connected, with a first appropriate length of an uncoupled microstrip line, to the output;

a film of a single crystal high Tc superconductor material continuously defining said first, second, third, fourth and sixth microstrip lines;

a film of a single crystal high Tc superconductor material continuously defining said fifth microstrip line;

a film of a single crystal high Tc superconductor material continuously defining said seventh microstrip line;

means, connected to said microstrip lines, for applying an electric field to the phase shifter to change the permittivity of said respective ferroelectric films and thus to obtain a differential phase shift; and said phase shifter being operated at a constant high Tc superconducting temperature slightly above the Curie temperatures of the ferroelectric materials.

8. A ferroelectric phase shifter of claim 7 wherein the phase shifter is a monolithic microwave integrated circuit (MMIC).

* * * * *